United States Patent
Park et al.

(10) Patent No.: US 8,628,202 B2
(45) Date of Patent: Jan. 14, 2014

(54) OPTICAL FILTER AND ORGANIC LIGHT-EMITTING DEVICE INCLUDING THE SAME

(75) Inventors: Soon-Ryong Park, Yongin (KR); Woo-Suk Jung, Yongin (KR)

(73) Assignee: Samsung Display Co., Ltd. (KR)

( * ) Notice: Subject to any disclaimer, the term of this patent is extended or adjusted under 35 U.S.C. 154(b) by 360 days.

(21) Appl. No.: 13/009,783

(22) Filed: Jan. 19, 2011

(65) Prior Publication Data

US 2011/0228510 A1 Sep. 22, 2011

(30) Foreign Application Priority Data

Mar. 16, 2010 (KR) .................. 10-2010-0023399

(51) Int. Cl.
*F21V 9/14* (2006.01)

(52) U.S. Cl.
USPC .......... 362/19; 359/483.1; 359/642; 359/885; 427/162; 427/163.1; 362/293

(58) Field of Classification Search
USPC ............ 362/19, 293; 359/49.01, 642, 483.01, 359/885; 427/162, 163.1
See application file for complete search history.

(56) References Cited

U.S. PATENT DOCUMENTS

| | | | |
|---|---|---|---|
| 6,706,339 B1 | 3/2004 | Miyatake et al. | |
| 2002/0005509 A1 | 1/2002 | Teng | |
| 2002/0006505 A1 | 1/2002 | Nishizawa et al. | |
| 2004/0156086 A1* | 8/2004 | Nishizawa et al. | ........... 359/241 |
| 2007/0047055 A1 | 3/2007 | Kumar et al. | |
| 2009/0040619 A1* | 2/2009 | Choi et al. | ..................... 359/614 |
| 2009/0185271 A1 | 7/2009 | Yaegashi et al. | |

FOREIGN PATENT DOCUMENTS

| | | |
|---|---|---|
| JP | 2001-13326 A | 1/2001 |
| JP | 2002-62423 A | 2/2002 |
| JP | 2002-540442 A | 11/2002 |
| JP | 2009-193047 A | 8/2009 |
| KR | 1019990007745 A | 5/1999 |
| KR | 10-2006-0026123 | 3/2006 |
| KR | 10-2006-0084168 A | 7/2006 |
| KR | 1020060084168 A | 7/2006 |
| KR | 1020060096838 A | 9/2006 |
| KR | 10-2009-0003614 A | 1/2009 |
| WO | WO 98/14443 | 4/1998 |

OTHER PUBLICATIONS

Official Action issued by the Korean Industrial Property Office dated Jun. 21, 2011 in Korean Patent Application No. 10-2010-0023399, 3 pages.

Registration Determination Certificate issued by the Korean Intellectual Property Office dated Apr. 30, 2012, 5 pages.

* cited by examiner

*Primary Examiner* — Stephen F Husar
*Assistant Examiner* — Meghan Dunwiddie
(74) *Attorney, Agent, or Firm* — Knobbe Matens Olson & Bear, LLP

(57) ABSTRACT

An optical filter having improved visibility under external light and an organic light-emitting device including the same.

19 Claims, 1 Drawing Sheet

OPTICAL FILTER AND ORGANIC LIGHT-EMITTING DEVICE INCLUDING THE SAME

CROSS-REFERENCE TO RELATED APPLICATIONS

This application claims the benefit of Korean Patent Application No. 10-2010-0023399, filed on Mar. 16, 2010, in the Korean Intellectual Property Office, the disclosure of which is incorporated herein in its entirety by reference.

BACKGROUND

1. Field

The present embodiments relate to an optical filter and an organic light-emitting device including the same.

2. Description of the Related Technology

Typically, an organic light-emitting device includes an anode (first electrode), a cathode (second electrode) and an organic layer interposed between the anode and the cathode. In the organic light-emitting device, as a voltage is applied between the anode and the cathode, holes are injected from the anode to the organic layer, while electrons are injected from the cathode to the organic layer. The holes and electrons injected into the organic layer combine to generate exitons. When the exitons drop from an excitation state into a ground state, light is emitted.

In the organic light-emitting device, the anode constitutes a reflective electrode, whereas the cathode constitutes a transparent electrode. Thus, when the organic light-emitting device operates, light emitted from the organic layer is reflected from the reflective electrode and is externally emitted by passing through the transparent electrode.

In this regard, nearly 100% of internal light is externally emitted, whereas about 40% of external light is reflected. As a result, an image may appear incomplete. In particular, dark colors of the image may not be sufficiently discernable, so that a contrast ratio and visibility of the image may be lowered. Thus, a polarizing film may be attached to an external surface of the organic light-emitting device in order to reduce the reflection of external light.

Reflectance of the external light may be lowered to about 4% due to the attachment of the polarizing film having the structure described above. However, transmittance of the internal light may also be lowered to about 43%, thereby causing loss of light. Therefore, there is a demand to reduce such a loss of light and power consumption that is greater due to the higher-luminance of the organic light-emitting device.

SUMMARY

The present embodiments provide an optical filter having a novel structure.

The present embodiments also provide an organic light-emitting device including the optical filter.

According to an aspect of the present embodiments, there is provided an optical filter including: a photochromic layer; a polarizing film; a retardation film; and a color adhesive layer, wherein the photochromic layer includes a first dye for selectively absorbing a first light beam having a wavelength from 460 to 540 nm and a second dye for selectively absorbing a second light beam having a wavelength from 560 to 665 nm, and the color adhesive layer includes a light absorbing material for selectively absorbing the first and second light beams.

A first light beam transmittance of the first light beam of the photochromic layer may be 50% or less.

A second light beam transmittance of the second light beam of the photochromic layer may be 50% or less.

The first dye may include a spiroxazine compound or a naphthopyran compound.

The second dye may include a spiroxazine compound or a naphthopyran compound.

A weight ratio of the first dye to the second dye may be in a range of 1:1 to 1:5.

A thickness of the photochromic layer may be from 0.1 to 20 μm

First and second light beam transmittance of the color adhesive layer may be 50% or less.

The light absorbing material may be carbon black.

A thickness of the color adhesive layer may be from 0.1 to 10 μm

The polarizing film may include a matrix, iodine, and a third dye.

A weight ratio of the iodine to a third dye may be in the range of 1:1 to 1:2.

A thickness of the polarizing film may be from 15 to 30 μm.

The optical filter may further include a first base layer disposed between the polarizing film and the photochromic layer, and a second base layer disposed between the polarizing film and the color adhesive layer.

The first and second base layers may be each triacetyl cellulose (TAC).

According to another aspect of the present embodiments, there is provided an organic light-emitting device including: a substrate including an organic light-emitting element; and an optical filter located on a path of light emitted from the organic light-emitting element, wherein the optical filter is the optical filter.

Assuming that an intensity of a first light beam having a peak wavelength of 460 to 540 nm emitted from the organic light-emitting element is A, and the intensity of the first light beam that has passed through the optical filter after being emitted from the organic light-emitting element is B, B/A×100(%) may be equal to or less than 50%, and assuming that an intensity of a second light beam having a peak wavelength of 560 to 665 nm emitted from the organic light-emitting element is C, and the intensity of the second light beam that has passed through the optical filter after being emitted from the organic light-emitting element is D, D/C×100(%) may be equal to or less than 50%.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION

Reference will now be made in detail to the exemplary embodiments, examples of which are illustrated in the accompanying drawings.

Figure 1:
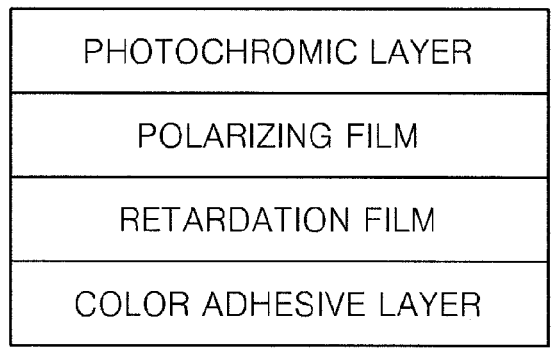
FIG. 1 is a diagram of an optical filter according to an embodiment.

FIG. 1 is a diagram of an optical filter according to an embodiment.

The optical filter according to the current embodiment includes a photochromic layer, a polarizing film, a retardation film, and a color adhesive layer. The photochromic layer includes a first dye that selectively absorbs a first light beam having a wavelength from about 460 to about 540 nm, and a second dye that selectively absorbs a second light beam having a wavelength from about 560 to about 665 nm. The color adhesive layer includes a light absorbing material that selectively absorbs the first light beam and the second light beam.

Here, absorbing a light beam means that energy corresponding to a wavelength of the light beam is absorbed. A material has an intrinsic band structure according to its structure. Here, a band almost filled with electrons is referred to as a valence band, a band that is not almost filled with electrons is referred to as a conduction band, and the energy difference between these two bands is referred to as a band gap. As electrons in a material are excited from a valence band to a conduction band, the electrons absorb energy corresponding to a band gap. Such a process represents a process of absorbing a light beam.

Also, selectively absorbing a light beam means that, since a certain material has a certain band gap according to its intrinsic band structure, electrons in the certain material absorb only energy of a certain wavelength corresponding to the band gap, and not energy of other wavelengths. Since a material such as a dye has an intrinsic band gap according to its structure, for example, according to a number of locations of benzene rings, electrons in the material absorb certain energy corresponding to the intrinsic band gap. Such a process represents a process of selectively absorbing a light beam.

The photochromic layer includes a photochromic dye. The photochromic dye is a dye that changes its color due to sunlight or ultraviolet rays generated by an electric device. An example of the photochromic dye includes a dye used for a product such as sunglasses that are darkened as silver oxide (AgO) is separated when ultraviolet rays are irradiated thereon. Generally, when a photochromic material is used for an optical filter, visibility of black is good outdoors since the optical filter absorbs light in a wavelength of a visible ray domain, but at the same time, the optical filter also absorbs external light, and thus the external light is lost, and an effect of increased visibility of black is reduced. However, when light of a certain wavelength is selectively absorbed by using a certain dye, the visibility of black may be increased without a loss of internal light, thereby increasing visibility under external light. Here, visibility under external light means visibility of a displayed image against external light.

Wavelength bands of colors used in an organic light-emitting element are from about 440 to about 460 nm in the case of blue, from about 540 to about 560 nm in the case of green, and from about 665 to about 685 nm in the case of red. Thus, lights in the above wavelengths are not absorbed while lights in other wavelengths are absorbed, thereby increasing visibility under external light of an organic light-emitting device. Since the photochromic layer includes the first dye for selectively absorbing the first light beam having a wavelength from about 460 to about 540 nm, and the second dye for selectively absorbing the second light beam having a wavelength from about 560 to about 665 nm, lights in wavelengths other than blue, green, and red may be absorbed.

The color adhesive layer fundamentally adheres the polarizing film to a base layer, or the optical filter to the organic light-emitting element. The color adhesive layer is mostly formed of a binder resin, and may include at least one selected from the group consisting of an acryl-based polymer, a silicon-based polymer, an ester-based polymer, an urethane-based polymer, an amide-based polymer, an ester-based polymer, a fluoro-based polymer, and rubber. In addition, the binder resin may be an acryl-based polymer and/or a silicon-based polymer. The color adhesive layer includes a light absorbing material that selectively absorbs the first light beam having a wavelength from about 460 to about 540 nm and the second light beam having a wavelength from about 560 to about 665 nm, which are outside the range of wavelengths of blue, green, and red.

Transmittance of the first light beam and transmittance of the second light beam in the photochromic layer may be each about 50% or less. When the transmittance is within the above range, reflectivity of external light may decrease, and thus visibility may be increased.

The first dye for absorbing the first light beam and the second dye for absorbing the second light beam may include a spiroxazine compound or a naphthopyran compound.

Examples of the spiroxazine compound include 1,3,3-trimethylspiro[indolino-2,3'-[3H]naphth[2,1-b][1,4]oxazine], 5-methoxy-1,3,3-trimethylspiro[indolino-2,3'-[3H]naphth[2,1-b][1,4]oxazine], 5-chloro-1,3,3-trimethylspiro[indolino-2,3'-[3H]naphth[2,1-b][1,4]oxazine], 4,7-diethoxy-1,3,3-trimethylspiro[indolino-2,3'-[3H]naphth[2,1-b][1,4]oxazine], 5-chloro-1-butyl-3,3-dimethylspiro[indolino-2,3'-[3H]naphth[2,1-b][1,4]oxazine], 1,3,3,5-tetramethyl-9'-ethoxyspiro[indolino-2,3'-[3H]naphth[2,1-b][1,4]oxazine], 1-benzyl-3,3-dimethylspiro[indoline-2,3'-[3H]naphth[2,1-b][1,4]oxazine], 1-(4-methoxybenzyl)-3,3-dimethylspiro[indoline-2,3'-[3H]naphth[2,1-b][1,4]oxazine], 1-(2-methylbenzyl)-3,3-dimethylspiro[indoline-2,3'-[3H]naphth[2,1-b][1,4]oxazine], 1-(3,5-dimethylbenzyl)-3,3-dimethylspiro[indoline-2,3'-[3H]naphth[2,1-b][1,4]oxazine], 1-(4-chlorobenzyl)-3,3-dimethylspiro[indoline-2,3'-[3H]naphth[2,1-b][1,4]oxazine], 1-(4-bromobenzyl)-3,3-dimethylspiro[indoline-2,3'-[3H]naphth[2,1-b][1,4]oxazine], 1-(2-fluorobenzyl)-3,3-dimethylspiro[indoline-2,3'-[3H]naphth[2,1-b][1,4]oxazine], 1,3,5,6-tetramethyl-3-ethylspiro[indoline-2,3'-[3H]pyrido[3,2-f][1,4]benzoxazine], 1,3,3,5,6-pentamethylspiro[indoline-2,3'-[3H]pyrido[3,2-f][1,4]benzoxazine], 6'-(2,3-dihydro-1H-indol-1-il)-1,3-dihydro-3,3-dimethyl-1-propyl-spiro[2H-indol-2,3'-[3H]naphth[2,1-b][1,4]oxazine], 6'-(2,3-dihydro-1H-indol-1-il)-1,3 dihydro-3,3-dimethyl-1-(2-methylpropyl)-spiro[2H-indol-2,3'-[3H]-naphth[2,1-b][1,4]oxazine], 1,3,3-trimethyl-1-6'-(2,3-dihydro-1H-indol-1-il)-spiro[2H-indol-2,3'-[3H]naphth[2,1-b][1,4]oxazine], 1,3,3-trimethyl-6'-(1-piperidinyl)-spiro[2H-indol-2,3'-[3H]naphth[2,1-b][1,4]oxazine], 1,3,3-trimethyl-6'-(1-piperidinyl)-spiro[2H-indol-2,3'-[3H]naphth[2,1-b][1,4]oxazine], 1,3,3-trimethyl-6'-(1-piperidinyl)-6-(trifluoromethyl)-spiro[2H-indol-2,3'-[3H]naphth[2,1-b][1,4]oxazine], and 1,3,3,5,6-pentamethyl-spiro[2H-indol-2,3'-[3H]naphth[2,1-b][1,4]oxazine].

Examples of the naphthopyran compound include 3,3-diphenyl-3H-naphtho[2,1-b]pyran, 2,2-diphenyl-2H-naphtho[2,1-b]pyran, 3-(2-fluorophenyl)-3-(4-methoxyphenyl)-3H-naphtho[2,1-b]pyran, 3-(2-methyl-4-methoxyphenyl)-3-(4-ethoxyphenyl)-3H-naphtho[2,1-b]pyran, 3-(2-puryl)-3-(2-fluorophenyl)-3H-naphtho[2,1-b]pyran, 3-(2-thienyl)-3-(2-fluoro-4-methoxyphenyl)-3H-naphtho[2,1-b]pyran, 3-{2-(1-methylpyrrolidinyl)}-3-(2-methyl-4-methoxyphenyl)-3H-naphtho[2,1-b]pyran, spiro(bicyclo[3.3.1]nonan-9,3'-3H-naphtho[2,1-b]pyran), spiro(bicyclo[3.3.1]nonan-9-2'-3H-naphtho[2,1-b]pyran), 4-[4-[6-(4-morfolynil)-3-phenyl-3H-naphtho[2,1-b]pyran-3-il]phenyl]-morpholine, 4-[3-(4-methoxyphenyl)-3-phenyl-3H-naphtho[2,1-b]pyran-6-il]-morpholine, 4-[3,3-bis(4-methoxyphenyl)-3H-naphtho[2,1-b]pyran-6-il]-morpholine, 4-[3-phenyl-3-[4-(1-piperidinyl)phenyl]-3H-naphtho[2,1-b]pyran-6-il]-morpholine, and 2,2-diphenyl-2H-naphtho[2,1-b]pyran.

Types and concentrations of the first and second dyes included in the photochromic layer are not limited by light beams absorbed by the photochromic layer. For example, a weight ratio of the first dye to the second dye may be from about 1:1 to about 1:5.

The photochromic layer includes both the first and second dyes together, and thus simultaneously absorbs the first light beam having a wavelength from about 460 to about 540 nm and the second light beam having a wavelength from about 560 to about 665 nm. Accordingly, intensities at a point where a blue peak wavelength and a green peak wavelength cross each other and a point where a green peak wavelength and a red peak wavelength cross each other are decreased in an emission spectrum, and color purity and color reproduction of an organic light-emitting element using a filter including the photochromic layer may be improved.

The thickness of the photochromic layer may be generally from about 0.1 to about 20 μm When the thickness of the photochromic layer is about 0.1 μm or above, the photochromic layer may be coated to a uniform thickness and light absorptivity may reach a suitable level, and when the thickness of the photochromic layer is about 20 μm or less, generation of a bubble or cracking of a coating layer during a manufacturing process may be suppressed.

The color adhesive layer may include the light absorbing material that selectively absorbs the first light beam having the wavelength from about 460 to about 540 nm, and the second light beam having the wavelength from about 560 to about 665 nm. Transmittances of the first and second light beams are decreased to about 50% or less by passing through the color adhesive layer, and transmittances of red, green, and blue lights may be above about 50%. When the transmittances of the first and second light beams are about 50% or less, color reproduction of the organic light-emitting element is increased without deterioration of visibility of black.

Any light absorbing material may be included in the color adhesive layer as long as it absorbs the first light beam having the wavelength from about 460 to about 540 nm and the second light beam having the wavelength from about 560 to about 665 nm.

Examples of the light absorbing material include carbon black, a black inorganic material, an organic material, a pigment-based metal, and other metals. Types and concentrations of the light absorbing material used in the color adhesive layer are not limited by a light beam absorbed by the color adhesive layer.

In some embodiments, the light absorbing material may be carbon black.

The thickness of the color adhesive layer may be from about 0.1 to about 10 μm When the thickness of the color adhesive layer is about 0.1 μm or above, the color adhesive layer may be coated to a uniform thickness and viscosity and light absorptivity may reach suitable levels, and when the thickness of the color adhesive layer is about 10 μm or less, cracking of a coating layer may be suppressed.

The polarizing film is a film that generates a polarization effect, has a matrix structure, and further includes iodine and a third dye. The matrix may include polyvinyl alcohol (PVA).

The polarizing film may include both the iodine and the third dye. When the polarizing film is formed by incorporating the iodine into PVA, chains of iodine ions are oriented due to the chains of the PVA that are oriented by drawing, thereby exhibiting polarizing properties. When PVA contains iodine, the PVA may have excellent polarizing efficiency and transmittance. However, due to the sublimation of the iodine, durabilities with respect to temperature, humidity, and light may degrade, thereby finally degrading uniformity of the PVA.

When the polarizing film is formed by incorporating the third dye into the PVA, the third dye is oriented in the same manner as when using the iodine, due to the chains of the PVA that are oriented by drawing, thereby exhibiting polarizing properties. However, when PVA includes such a dye, the PVA may have excellent durability due to a lack of sublimating iodine. However, dichroism of the PVA may be poor. When the polarizing film is formed by incorporating both the third dye, which provides excellent uniformity and durability, and the iodine into PVA, insufficient uniformity of PVA associated with the exclusive use of the iodine may be compensated for by the third dye.

The third dye may be any dye that may be used in the manufacture of dye-based polarizing films. For example, the third dye may be a dye having any of the following structures:

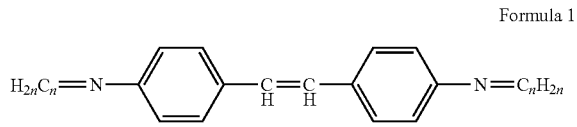

Formula 1

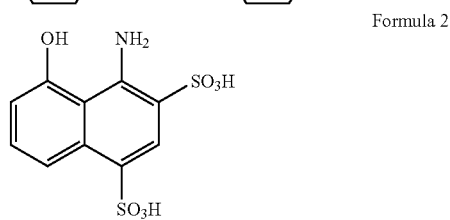

Formula 2

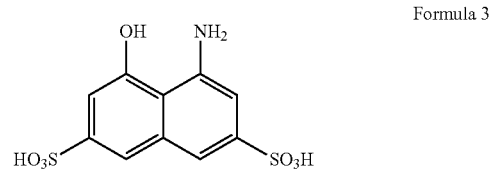

Formula 3

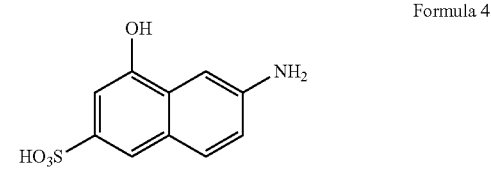

Formula 4

In Formula 1, n is an integer from 1 to 4.

A weight ratio of the iodine to the third dye used in the polarizing film may be from about 1:1 to about 1:2. If the weight ratio of the iodine to the third dye is within this range, uniformity and a degree of polarization may be excellent.

The thickness of the polarizing film may be from about 15 to about 30 μm When the thickness of the polarizing film is within this range, the optical filter including the polarizing film is slim and strong against impacts.

The polarizing film has an absorption axis and a polarization axis. The absorption axis is an axis along which the chains of iodine ions and the third dye are extended by drawing. The absorption axis destructs one of two perpendicular components of light oscillating in arbitrary directions while electric energy of the light is converted to electronic energy by the interaction of the perpendicular component with electrons of the polarizing film. The polarization axis is an axis perpendicular to the absorption axis, and transmits light oscillating in the direction of the polarization axis.

The polarizing film may be manufactured by using a method of drawing a PVA film and then adsorbing the iodine and the third dye thereto, a method of adsorbing the iodine and the third dye to a PVA film and then drawing the PVA film, or a method of dyeing the iodine and the third dye to a PVA film while drawing the PVA film.

The retardation film may be a λ/4 retardation film. The λ/4 retardation film converts linearly polarized light to a circularly polarized light or visa versa by giving a phase difference of λ/4 to two polarization components that are parallel to an optical axis of the retardation film and are perpendicular to each other.

The retardation film converts internal light emitted from the organic light-emitting device from a circularly polarized light to a linearly polarized light or visa versa.

The retardation film may include polyethylene terephthalate (PET) or tri-acetyl-cellulose (TAC), and may be formed by rubbing a film of PET or TAC with a piece of velvet to give directivity on a surface of the film, and then coating the film with liquid crystals by using a coater and drying the coated film.

Alternatively, the retardation film may be formed by coating the film of PET or TAC with a photoalignment layer, irradiating a laser onto the film to give directivity on a surface of the film, coating the film with liquid crystals by using a coater, and then drying the coated film.

According to an embodiment, the optical filter may have a structure in which the color adhesive layer, the retardation film, the polarizing film, and the photochromic layer are sequentially stacked in the stated order.

Figure 2:
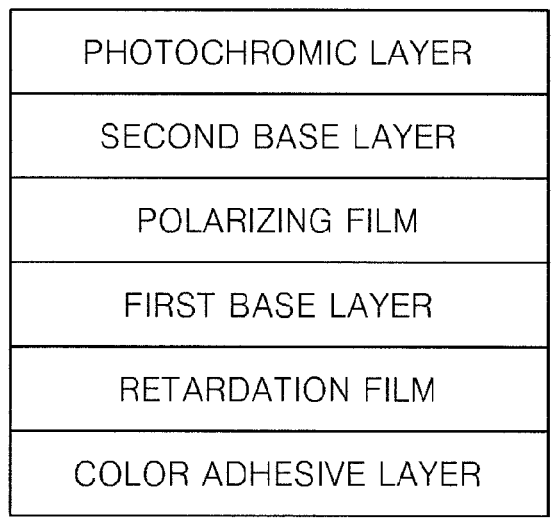
FIG. 2 is a diagram illustrating an optical filter according to another embodiment.

FIG. 2 is a cross-sectional view of an optical filter according to another embodiment.

According to the optical filter, a base layer may be formed on top and bottom surfaces of the polarizing film so as to protect the polarizing film. For example, the optical filter includes a photochromic layer, a polarizing film, a retardation film, and a color adhesive layer, and may further include a first base layer disposed between the polarizing film and the photochromic layer and a second base layer disposed between the polarizing film and the color adhesive layer.

The first base layer supports and protects the polarizing film, and enhances durability, moisture resistance, and mechanical strength of the polarizing film. The first base layer may be formed of a material that has high light transmittance, has low birefringence, and easily becomes hydrophilic by reforming a surface thereof. For example, the first base layer may be formed of tri-acetyl-cellulose. A thickness of the first base layer may be from about 50 to about 100 μm for sufficient strength. The second base layer supports the polarizing film and protects the polarizing film from an external impact, or the like. The material and a thickness of the second base layer may be substantially identical to those of the first base layer.

The optical filter includes the photochromic layer, the polarizing film, the retardation film, the color adhesive layer, the first base layer, and the second base layer, wherein the first base layer may be disposed between the polarizing film and the retardation film, and the second base layer may be disposed between the polarizing film and the photochromic layer.

According to an embodiment, the optical filter has a structure in which the color adhesive layer, the retardation film, the first base layer, the polarizing film, the second base layer, and the photochromic layer are stacked in the order stated.

According to another embodiment, an organic light-emitting device may includes a substrate on which an organic light-emitting element is disposed, and an optical filter located on a path of light emitted from the organic light-emitting element.

The organic light-emitting element includes a first electrode; a second electrode facing the first electrode; and an organic layer disposed between the first electrode and the second electrode. For example, the organic light-emitting element may have a first electrode/hole injection layer (HIL)/emission layer (EML)/second electrode structure, a first electrode/HIL/hole transport layer (HTL)/EML/electron transport layer (ETL)/second electrode structure, or a first electrode/HIL/HTL/EML/ETL/electron injection layer (EIL)/second electrode structure. Alternatively, the organic light-emitting element may have a first electrode/single layer having both hole injection and hole transport capabilities/EML/ETL/second electrode structure, or a first electrode/single layer having both hole injection and hole transport capabilities/EML/ETL/EIL/second electrode structure.

The first electrode may constitute an anode or a cathode. The substrate may be a substrate conventionally used in organic light-emitting devices, and may include a glass substrate or a transparent plastic substrate, which has excellent mechanical strength, thermal stability, transparency, surface planarity, handling convenience, and water resistance. Examples of a material for forming the first electrode include indium tin oxide (ITO), indium zinc oxide (IZO), tin oxide ($SnO_2$), zinc oxide (ZnO), aluminum (Al), silver (Ag), and magnesium (Mg), which have excellent conductivity, and the first electrode may be a transparent or reflective electrode.

The HIL may be formed of any known materials used to form a HIL. Examples of a material for forming the HIL include, but are not limited to, a phthalocyanine compound such as copper phthalocyanine, 4.4'0.4"-tris(3-methylphenylphenylamino) triphenylamine (m-MTDATA), N,N'-di(1-naphthyl)-N,N'-diphenylbenzidine) (NPB), TDATA, 2-TNATA, polyaniline/dodecylbenzenesulfonic acid (Pani/DBSA), poly(3,4-ethylenedioxythiophene)/poly(4-styrenesulfonate (PEDOT/PSS), polyaniline/camphor sulfonicacid (Pani/CSA), and (polyaniline)/poly(4-styrenesulfonate) (PANI/PSS).

The HTL may be formed of any known materials used to form a HTL. Examples of a material for forming the HTL include, but are not limited to, cabazol derivatives such as N-phenylcarbazol or polyvinylcarbazol, and amine derivatives having an aromatic condensed ring, such as NPB, N,N'-bis(3-methylphenyl)-N,N'-diphenyl-[1,1-biphenyl]-4,4'-diamine (TPD), and N,N'-di(naphthalene-1-yl)-N,N'-diphenyl benzidine (α-NPD).

The EML may be formed using various known light-emitting materials, such as known hosts and dopants. Dopants used to form the EML may include either a fluorescent dopant or a phosphorescent dopant, which are widely known in the art. Examples of the host may include, but are not limited to, $Alq_3$, 4,4'-N,N'-dicarbazole-biphenyl (CPB), 9,10-di(naphthalene-2-yl)anthracene (ADN), and distyrylarylene (DSA). Examples of well-known red dopants include, but are not limited to, platinum(II) octaethylporphyrin (PtOEP), $Ir(piq)_3$, $Btp_2Ir(acac)$, and DCJTB. Examples of well-known green dopants include, but are not limited to, $Ir(ppy)_3$ (ppy=phenylpyridine), $Ir(ppy)_2(acac)$, $Ir(mpyp)_3$, and 10-(2-benzothiazolyl)-2,3,6,7-tetrahydro-1,1,7,7-tetramethyl-1H, 5H,11H-(1)benzopyropyrano(6,7-8-i,j)quinolizine-11-on (C545T). Examples of well-known blue dopants include, but are not limited to, $F_2Irpic$, $(F_2ppy)_2Ir(tmd)$, $Ir(dfppz)_3$, terfluorene, 4,4'-bis (4-diphenylaminostyryl)biphenyl (DPAVBi), and 2,5,8,11-tetra-t-butyl pherylene (TBP).

The ETL may be formed of any known materials used to form an ETL. Examples of a material for forming the ETL include, but are not limited to, quinoline derivatives, such as tris(8-quinolinolate)aluminum ($Alq_3$), TAZ, and Balq.

The EIL may be formed of any known materials used to form an EIL. Examples of a material for forming the EIL include LiF, NaCl, CsF, $Li_2O$, BaO, and the like. The deposition or coating conditions for forming the EIL may be similar to those applied to form the HIL, although the deposition and coating conditions may vary according to the material that is used to form the EIL.

The second electrode may constitute a cathode or an anode. A material for forming the second electrode may include a metal, an alloy, or an electrically conductive compound, materials which have a low work function, or a mixture thereof. Examples of such materials may include, but are not limited to, lithium (Li), magnesium (Mg), aluminum (Al), aluminum-lithium (Al—Li), calcium (Ca), magnesium-indium (Mg—In), and magnesium-silver (Mg—Ag). In addition, in order to manufacture a top-emission organic light-emitting device, a transparent cathode formed of ITO or IZO may be used as the second electrode.

An adhesive agent may be used to adhere the optical filter to the substrate of the organic light-emitting device. The adhesive agent may be a pressure sensitive adhesive (PSA). For example, the color adhesive agent described above may be used.

The adhesive agent may contain an acrylic copolymer that has a high elasticity coefficient and good adhesive characteristics and may suppress generation of fine air bubbles between the substrate and an adhesive layer to prevent separation of the adhesive layer. In addition to adhering the optical filter to the substrate, the adhesive agent enhances moisture resistance of the optical filter and has an elasticity to protect the optical filter from external impacts.

Assuming that an intensity of a first light beam having a peak wavelength of from about 470 to about 510 nm emitted from the organic light-emitting element is A, and the intensity of the first light beam that has passed through the optical filter after being emitted from the organic light-emitting element is B, $B/A \times 100(\%)$ may be equal to or less about 50%. In addition, assuming that an intensity of a second light beam having a peak wavelength of about 540 to about 610 nm emitted from the organic light-emitting element is C, and the intensity of the second light beam that has passed through the optical filter after being emitted from the organic light-emitting element is D, $D/C \times 100(\%)$ may be equal to or less about 50%.

Hereinafter, one or more embodiments will be described in detail with reference to the following examples. These examples are not intended to limit the purpose and scope of the one or more embodiments.

Example 1

A PVA film was dyed in an aqueous solution containing 0.28 g/L of iodine and 0.37 g/L of dye represented by Formula 2 above, and then was drawn 5 times to prepare a polarizing film having a thickness of 20 μm A resin solution containing 0.1 g of 1,3,3-trimethylspiro[indolino-2,3'-[3H]naphth[2,1-b][1,4]oxazine] having transmittance of 45% at the maximum absorption peak wavelength of 490 nm, 0.2 g of 3,3-diphenyl-3H-naphtho[2,1-b]pyran (first dye) having transmittance of 45% at the maximum absorption peak wavelength of 610 nm, and 3 g of a hardener was prepared.

A PET film was used as a retardation film, and an acryl-based polymer including carbon black was used to form a color adhesive layer.

The polarizing film was adhered on the retardation film by using an adhesive, and the resin solution having a photochromic characteristic was coated as a photochromic layer on the polarizing film. The resulting product was dried, and a thickness of the photochromic layer was 10 μm Next, the color adhesive layer was adhered to one surface of the polarizing film, thereby obtaining an optical filter.

Example 2

A PVA film was dyed in an aqueous solution containing 0.28 g/L of iodine and 0.37 g/L of dye represented by Formula 2 above, and then was drawn 5 times to prepare a polarizing film having a thickness of 10 μm A resin solution containing 0.1 g of 1,3,3-trimethylspiro[indolino-2,3'-[3H]naphth[2,1-b][1,4]oxazine] having transmittance of 45% at the maximum absorption peak wavelength of 490 nm, 0.3 g of 3,3-diphenyl-3H-naphtho[2,1-b]pyran (first dye) having transmittance of 45% at the maximum absorption peak wavelength of 610 nm, and 3 g of a hardener was prepared.

An optical filter was prepared in the same manner as Example 1, except for the above preparation.

Example 3

An optical filter was prepared in the same manner as in Example 1, except that a resin solution containing 0.05 g of 1,3,3-trimethylspiro[indolino-2,3'-[3H]naphth[2,1-b][1,4]oxazine] having transmittance of 45% at the maximum absorption peak wavelength of 490 nm, 0.25 g of 3,3-diphenyl-3H-naphtho[2,1-b]pyran (first dye) having transmittance of 45% at the maximum absorption peak wavelength of 610 nm, and 3 g of a hardener was prepared.

Comparative Example 1

An optical filter was prepared in the same manner as in Example 1, except that a resin solution containing 0.4 g of 1',3',3'-trimethylspiro(2H-1-benzopyran-2,2'-indoline) having transmittance of 55% at the maximum absorption peak wavelength of 450 nm, and 3 g of hardener was prepared.

Visibilities under external light according to the amount of external light were measured by applying the optical filters according to Examples 1 through 3 and Comparative Example to a substrate including an organic light-emitting element and the visibilities under external light are shown in Table 1.

Visibility under external light is obtained by dividing luminance of light measured from the outside of an optical filter while irradiating white light as internal light and standard light D65 (key light) as external light to the optical filter by luminance of light measured from the outside of the optical filter while irradiating the standard light D65 (key light) as external light and not irradiating internal light to the optical filter.

TABLE 1

| Lux | Example 1 | Example 2 | Example 3 | Comparative Example 1 |
| --- | --- | --- | --- | --- |
| 2000 | 10.57 | 11.08 | 11.14 | 10.04 |
| 4000 | 6.03 | 6.25 | 6.29 | 5.24 |
| 6000 | 4.62 | 4.74 | 4.78 | 3.75 |

TABLE 1-continued

| Lux | Example 1 | Example 2 | Example 3 | Comparative Example 1 |
|---|---|---|---|---|
| 8000 | 3.92 | 4.01 | 4.04 | 3.02 |
| 10000 | 3.51 | 3.59 | 3.61 | 2.60 |

Referring to Table 1, the visibilities under external light are all 3.5 or above in Examples 1 through 3, but the visibility under external light is 3.0 or less in Comparative Example 1. Visibility under external light is considered to be excellent if it is 3 or above, and in Examples 1 through 3, the visibilities under external light have improved.

The optical filter according to the present embodiments has improved visibility under external light, improved luminance, and low power consumption.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. An optical filter comprising:
   a photochromic layer;
   a polarizing film;
   a retardation film; and
   a color adhesive layer,
   wherein the photochromic layer comprises a first dye which absorbs light having a wavelength from about 460 to about 540 nm and a second dye which absorbs light having a wavelength from about 560 to about 665 nm, and
   wherein the color adhesive layer comprises a light absorbing material which absorbs light having a wavelength from about 460 to about 540 nm and light having a wavelength from about 560 to about 665 nm.

2. The optical filter of claim 1, wherein transmittance of light having a wavelength from about 460 to about 540 nm of the photochromic layer is about 50% or less.

3. The optical filter of claim 1, wherein transmittance of light having a wavelength from about 560 to about 665 nm of the photochromic layer is about 50% or less.

4. The optical filter of claim 1, wherein the first dye comprises a spiroxazine compound or a naphthopyran compound.

5. The optical filter of claim 1, wherein the first dye comprises a spiroxazine compound.

6. The optical filter of claim 1, wherein the second dye comprises a spiroxazine compound or a naphthopyran compound.

7. The optical filter of claim 1, wherein the second dye comprises a naphthopyran compound.

8. The optical filter of claim 1, wherein the weight ratio of the first dye to the second dye is from about 1:1 to about 1:5.

9. The optical filter of claim 1, wherein the thickness of the photochromic layer is from about 0.1 to about 20 μm.

10. The optical filter of claim 1, wherein transmittance of light having a wavelength from about 460 to about 540 nm and light having a wavelength from about 560 to about 665 nm of the color adhesive layer is about 50% or less.

11. The optical filter of claim 1, wherein the light absorbing material is carbon black.

12. The optical filter of claim 1, wherein the thickness of the color adhesive layer is from about 0.1 to about 10 μm.

13. The optical filter of claim 1, wherein the polarizing film comprises a matrix, iodine, and a third dye.

14. The optical filter of claim 1, wherein the weight ratio of the iodine to a third dye is from about 1:1 to about 1:2.

15. The optical filter of claim 1, wherein the thickness of the polarizing film is from about 15 to about 30 μm.

16. The optical filter of claim 1, further comprising a first base layer disposed between the polarizing film and the photochromic layer, and a second base layer disposed between the polarizing film and the color adhesive layer.

17. The optical filter of claim 16, wherein the first and second base layers are each triacetyl cellulose (TAC).

18. An organic light-emitting device comprising:
   a substrate comprising an organic light-emitting element; and
   an optical filter located on a path of light emitted from the organic light-emitting element,
   wherein the optical filter is the optical filter of claim 1.

19. The optical light-emitting device of claim 18, wherein, assuming that an intensity of a first light beam having a peak wavelength of about 460 to about 540 nm emitted from the organic light-emitting element is A, and the intensity of the first light beam that has passed through the optical filter after being emitted from the organic light-emitting element is B, B/A×100 (%) is equal to or less than about 50%, and
   wherein assuming that an intensity of a second light beam having a peak wavelength of from about 560 to about 665 nm emitted from the organic light-emitting element is C, and the intensity of the second light beam that has passed through the optical filter after being emitted from the organic light-emitting element is D, D/C×100 (%) is equal to or less than about 50%.

* * * * *